(12) United States Patent
De Cicco et al.

(10) Patent No.: US 10,945,323 B1
(45) Date of Patent: Mar. 9, 2021

(54) DETECTING LED FAILURE CONDITIONS

(71) Applicant: Infineon Technologies AG, Neubiberg (DE)

(72) Inventors: Adolfo De Cicco, Castel d'Azzano (IT); Michael Weis, Planegg (DE); Gernot Unterweger, Latschach (AT); Rosario Chiodo, Selvazzano Dentro (IT); Dietrich Bonart, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/837,301

(22) Filed: Apr. 1, 2020

(51) Int. Cl.
  *H05B 45/50* (2020.01)
  *H05B 45/37* (2020.01)
  *H05B 45/3725* (2020.01)
  *G01R 31/3183* (2006.01)

(52) U.S. Cl.
  CPC ....... *H05B 45/50* (2020.01); *G01R 31/31835* (2013.01); *H05B 45/3725* (2020.01)

(58) Field of Classification Search
  None
  See application file for complete search history.

(56) References Cited

U.S. PATENT DOCUMENTS

| | | | |
|---|---|---|---|
| 2015/0008964 A1 | 1/2015 | Hopfgartner et al. | |
| 2015/0102726 A1* | 4/2015 | Yoneoka | H05B 45/14 315/121 |

* cited by examiner

*Primary Examiner* — Dedei K Hammond
(74) *Attorney, Agent, or Firm* — Shumaker & Sieffert, P.A.

(57) ABSTRACT

This disclosure includes systems, methods, and techniques for controlling a plurality of light-emitting diodes (LEDs). For example, a circuit includes a switching device, where the switching device is electrically connected to an LED of the plurality of LEDs, and where the switching device is configured to control whether the LED receives an electrical signal from a power source. Additionally, the circuit includes processing circuitry configured to determine that the LED is associated with a bright failure condition by attempting to prevent the LED from receiving the electrical signal from the power source using the switching device and disable the LED in response to detecting the bright failure condition.

18 Claims, 12 Drawing Sheets

DETECTING LED FAILURE CONDITIONS

TECHNICAL FIELD

This disclosure relates circuits for driving and controlling light-emitting diodes.

BACKGROUND

Driver circuits are often used to control a voltage, current, or power at a load. For instance, a light-emitting diode (LED) driver may control the power supplied to a string of light-emitting diodes. In some cases, LED driver circuits may accept an input signal including an input current and an input voltage and deliver an output signal including an output current and an output voltage. In some such cases, an LED driver circuit may regulate at least some aspects of the input signal and the output signal, such as controlling the output current emitted by the LED driver circuit. In some examples, an LED driver circuit may control a light intensity of a corresponding LED.

SUMMARY

In general, this disclosure is directed to one or more systems, devices, and techniques for detecting whether one or more failure conditions are present for each light-emitting diode (LED) of a plurality of LEDs. Failure conditions may include a "bright failure" condition where a controller is prevented from turning off an LED, a "dark failure" condition where a controller is prevented from turning on an LED, a "low-light" condition where an LED is unable to achieve greater than a threshold level of brightness while the LED is turned on, as examples. Processing circuitry, in some cases, may be configured to perform tests on the plurality of LEDs in order to identify one or more LEDs of the plurality of LEDs and subsequently perform one or more actions in order to correct, alter, or eliminate these failures. For example, the processing circuitry may determine that a set of LEDs of the plurality of LEDs are associated with the bright failure condition. It may be beneficial for the processing circuitry to disable the set of LEDs associated with the bright failure condition so that the set of LEDs do not continue to emit light while the controller turns off the plurality of LEDs.

In some examples, a circuit controls a plurality LEDs. The circuit includes a switching device, wherein the switching device is electrically connected to an LED of the plurality of LEDs, and wherein the switching device is configured to control whether the LED receives an electrical signal from a power source; and processing circuitry. The processing circuitry is configured to determine that the LED is associated with a bright failure condition by attempting to prevent the LED from receiving the electrical signal from the power source using the switching device; and disable the LED in response to detecting the bright failure condition.

In some examples, a method for controlling a plurality of LEDs includes controlling whether an LED of the plurality of LEDs receives an electrical signal from a power source; determining, by processing circuitry, that the LED is associated with a bright failure condition by attempting to prevent the LED from receiving the electrical signal from the power source using a switching device, wherein the switching device is electrically connected to the LED; and disabling, by the processing circuitry, the LED in response to detecting the bright failure condition.

In some examples, a system for controlling a plurality of LEDs includes the plurality of LEDs; a switching device, wherein the switching device is electrically connected to an LED of the plurality of LEDs, and wherein the switching device is configured to control whether the LED receives an electrical signal from a power source; and processing circuitry. The processing circuitry is configured to: determine that the LED is associated with a bright failure condition by attempting to prevent the LED from receiving the electrical signal from the power source using the switching device; and disable the LED in response to detecting the bright failure condition.

The summary is intended to provide an overview of the subject matter described in this disclosure. It is not intended to provide an exclusive or exhaustive explanation of the systems, devices, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF DRAWINGS

Like reference characters denote like elements throughout the description and figures.

DETAILED DESCRIPTION

Some lighting systems may control a set of switching devices, where each switching device of the set of switching devices controls whether a respective light emitting diode (LED) of a plurality of LEDs receives an electrical signal from a power source. In some examples, a system may perform a test in order to identify whether each LED of the plurality of LEDs is associated with one or more failure conditions. In some cases, the system may change a failure condition, correct a failure condition, or eliminate a failure condition associated with an LED of the plurality of LEDs. The system may include a sensing device configured to detect a set of LEDs that are associated with a bright failure condition which prevents each LED of the set of LEDs from turning off. It may be beneficial for the system to disable the set of LEDs associated with the bright failure condition. For example, the plurality of LEDs may form a matrix of LEDs, and the system may attempt to turn off every LED of the plurality of LEDs so that the plurality of LEDs do not emit any visible light. Since the set of LEDs associated with the bright failure condition may continue to emit light after the system attempts to turn off the set of LEDs, the system may disable the set of LEDs in order to prevent a situation in which LEDs continue to generate light while the system is attempting to prevent the LEDs generating light.

In some examples, a system comprising a plurality of LEDs can present one or more technical problems. In particular, one or more individual LEDs may exhibit the bright failure condition. This may cause the LEDs exhibiting the bright failure condition to appear as specks of light among a matrix which includes the plurality of LEDs, which is not ideal. This disclosure presents example techniques which represent a solution to these problems by using a circuit to permanently disable LEDs which exhibit the bright failure condition. In some examples, the techniques of this disclosure may also address low-light failure problems and dark failure problems with one or more LEDs. To do so, the techniques may permanently disable LEDs exhibiting the low-light failure condition and permanently disable LEDs exhibiting the dark failure condition. The techniques may include one or more techniques for permanently disabling select LEDs when the system is in a high-side configuration and one or more techniques for permanently disabling select LEDs when the system is in a low-side configuration.

Figure 1:
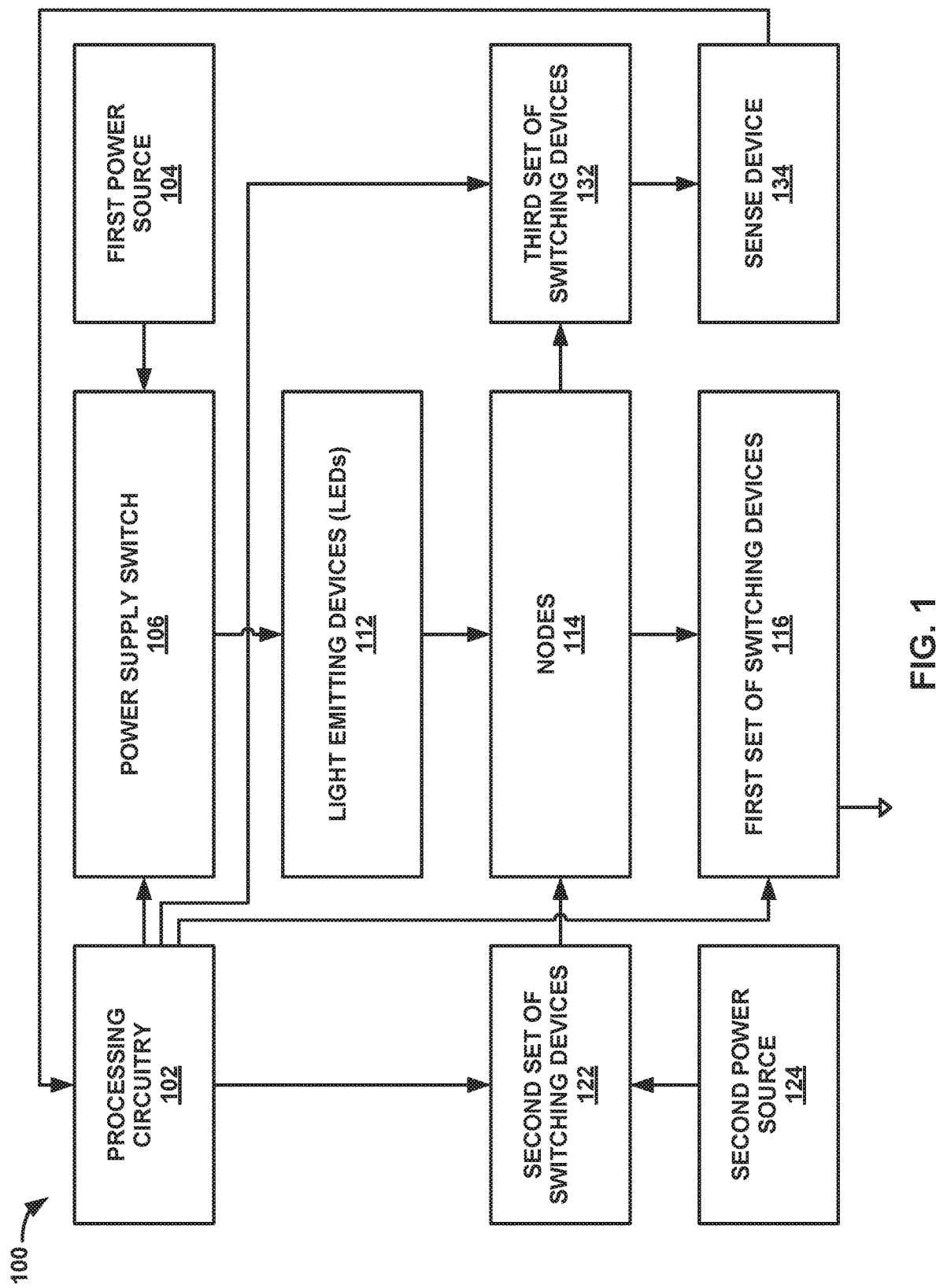
FIG. 1 is a block diagram illustrating a system for detecting one or more failure conditions in a plurality of LEDs, in accordance with one or more techniques of this disclosure.

FIG. 1 is a block diagram illustrating a system 100 for detecting one or more failure conditions in a plurality of LEDs 112, in accordance with one or more techniques of this disclosure. As seen in FIG. 1, system 100 includes processing circuitry 102, a first power source 104, power supply switch 106, LEDs 112, nodes 114, a first set of switching devices 116, a second set of switching devices 122, a second power source 124, a third set of switching devices 132, and a sense device 134.

In some examples, system 100 represents a system for controlling each LED of LEDs 112 in order to control whether each LED of LEDs 112 receives power from first power source 104. Additionally, in some examples, system 100 represents a system for determining whether each LED of LEDs 112 is associated with one or more failure conditions such as a bright failure condition, a dark failure condition, or a low-light failure condition. LEDs which are associate with the right failure condition may give off light even when processing circuitry 102 attempts to turn off these LEDs, thus making it difficult to completely prevent LEDs 112 from turning off and ceasing to generate light. As such, it may be beneficial to permanently disable LEDs which are associated with the bright failure condition. Additionally, in some cases, it may be beneficial to permanently disable LEDs which are associated with the low-light failure condition, since these LEDs may be incapable of generating light at greater than a threshold light intensity and it may be better to remove these LEDs from operation.

Processing circuitry 102, in some examples, may include one or more processors that are configured to implement functionality and/or process instructions for execution within system 100. For example, processing circuitry 102 may be capable of processing instructions stored in a memory (not illustrated in FIG. 1). Processing circuitry 102 may include, for example, microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, processing circuitry 102 may include any suitable structure, whether in hardware, software, firmware, or any combination thereof, to perform the functions ascribed herein to processing circuitry 102.

In some examples, a memory in communication with processing circuitry 102 includes computer-readable instructions that, when executed by processing circuitry 102, cause system 100 to perform various functions attributed to system 100 herein. The memory may include any volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital media.

First power source 104 is configured to deliver operating power to one or more components of system 100. In some examples, first power source 104 includes a battery and a power generation circuit to produce operating power. In some examples, first power source 104 is rechargeable to allow extended operation. First power source 104 may include any one or more of a plurality of different battery types, such as nickel cadmium batteries and lithium ion batteries. In some examples, a maximum voltage output of first power source 104 is approximately 12V. In some examples, first power source 104 supplies power within a range from 10 Watts (W) to 15 W. Power supply switch 106 may represent a switch which controls a flow of electrical current from first power source 104 to LEDs 112, causing LEDs 112 to emit photons (e.g., light). For example, when power supply switch is turned off (e.g., open), first power source 104 is not able to provide power to LEDs 112 and when power supply switch is turned on (e.g., closed), first power source 104 is able to provide power to LEDs 112.

LEDs 112 may comprise any suitable semiconductor light source. In some examples, an LED may comprise a p-n junction configured to emit light when activated. In some examples, LEDs 112 may be included in a headlight assembly for automotive applications. For instance, LEDs 112 may include a matrix, a string, or more than one string of light-emitting diodes to light a road ahead of a vehicle. As used herein, a vehicle may refer to motorcycles, trucks, boats, golf carts, snowmobiles, heavy machines, or any type of vehicle that uses directional lighting.

Any one or combination of power supply switch 106, the first set of switching devices 116, second set of switching devices 122, and the third set of switching devices 132 (collectively, "switching devices 106, 116, 122, 132") may, in some cases, include power switches such as, but not limited to, any type of field-effect transistor (FET) including any combination of metal-oxide-semiconductor field-effect transistors (MOSFETs), bipolar junction transistors (BJTs), insulated-gate bipolar transistors (IGBTs), junction field effect transistors (JFETs), high electron mobility transistors (HEMTs), or other elements that use voltage or current for control. Additionally, switching devices 106, 116, 122, 132 may include n-type transistors, p-type transistors, and power transistors, or any combination thereof. In some examples, switching devices 106, 116, 122, 132 include vertical transistors, lateral transistors, and/or horizontal transistors. In some examples, switching devices 106, 116, 122, 132 include other analog devices such as diodes and/or thyristors. In some examples, switching devices 106, 116, 122, 132 may operate as switches and/or as analog devices.

In some examples, each of switching devices 106, 116, 122, 132 include three terminals: two load terminals and a control terminal. For MOSFET switches, each of switching devices 106, 116, 122, 132 may include a drain terminal, a source terminal, and at least one gate terminal, where the control terminal is a gate terminal. For BJT switches, the control terminal may be a base terminal. Current may flow between the two load terminals of each of switching devices 106, 116, 122, 132, based on the voltage at the respective control terminal. Therefore, electrical current may flow across switching devices 106, 116, 122, 132 based on control signals delivered to the respective control terminals of switching devices 116 by processing circuitry 102. In one example, if a voltage applied to the control terminals of one or more of switching devices 106, 116, 122, 132 is greater than or equal to a voltage threshold, the one or more of switching devices 106, 116, 122, 132 may be turned on, allowing the one or more of switching devices 106, 116, 122, 132 to conduct electricity. Furthermore, one or more of switching devices 106, 116, 122, 132 may be deactivated when the voltage applied to the respective control terminals of the one or more of switching devices 106, 116, 122, 132 is below the threshold voltage, thus preventing the one or more of switching devices 106, 116, 122, 132 from conducting electricity. Processing circuitry 102 may be configured to independently control switching devices 106, 116, 122, 132 such that one, a combination, all, or none of switching devices 106, 116, 122, 132 may be turned on at a point in time.

Switching devices 106, 116, 122, 132 may include various material compounds, such as Silicon, Silicon Carbide, Gallium Nitride, or any other combination of one or more semiconductor materials. In some examples, silicon carbide switches may experience lower switching power losses. Improvements in magnetics and faster switching, such as Gallium Nitride switches, may allow switching devices 106, 116, 122, 132 to draw short bursts of current. These higher frequency switching devices may require control signals (e.g., voltage signals delivered by processing circuitry 102 to respective control terminals of switching devices 106, 116, 122, 132) to be sent with more precise timing, as compared to lower-frequency switching devices.

Each switching device of the first set of switching devices 116 may control an amount of power that a respective LED of LEDs 112 receives from first power source 104. In other words, each LED of LEDs 112 may be electrically connected to a respective switching device of switching devices 116. When a switching device of the first set of switching devices 116 is turned on, an electrical current may flow from first power source 104 across the LED of LEDs 112 corresponding to the switching device and across the switching device itself, causing the LED to emit photons (e.g., light). When the switching device is turned off, the switching device may prevent electrical current from flowing across the respective LED of LEDs 112, thus preventing the LED from emitting photons.

Nodes 114 may include one node corresponding to each LED of LEDs 112. In some examples, a node of nodes 114 may electrically connect an LED of LEDs 112 with a respective one of the first set of switching devices 116, a respective one of the second set of switching devices 122, and a respective one of the third set of switching devices 132. In this way, each of the one of the first set of switching devices 116, the one of the second set of switching devices 122, and the one of the third set of switching devices 132 may be configured to receive at least a portion of an output electrical signal from the respective LED of LEDs 112.

In some examples, processing circuitry 102 is configured to determine that a set of LEDs of LEDs 112 are associated with a bright failure condition by attempting to prevent each LED of LEDs 112 from receiving an electrical signal from first power source 104 using the respective switching devices of the first set of switching devices 116. For example, processing circuitry 102 may turn off each switching device of the first set of switching devices 116. Additionally, in some cases, processing circuitry may turn on each switching device of the third set of switching devices 132. Each switching device of the third set of switching devices 132 is configured to electrically connect or electrically disconnect each LED of LEDs 112 with sense device 134.

Sense device 134 includes circuitry which is configured to detect an electrical signal flowing through each LED of LEDs 112 which is electrically connected to sense device 134. As such, when processing circuitry 102 turns on all of the third set of switching devices 132 and turns off all of the first set of switching devices 116, processing circuitry 102 may be configured to determine a level of electrical current flowing through each one of LEDs 112 based on a sense signal generated by sense device 134. Processing circuitry 102 may be configured to determine, based on the sense signal, a set of LEDs of LEDs 112 which continue to conduct an electrical current above an electrical current threshold while a corresponding one of the first set of switching devices 116 is turned off. Processing circuitry 102 may identify this set of LEDs which continues to conduct the electrical current above the electrical current threshold as being associated with the bright failure condition.

Processing circuitry 102 may, in some cases, disable the set of the LEDs which processing circuitry 102 determines as being associated with the bright failure condition. In some examples, processing circuitry 102 disables the set of LEDs associated with the bright failure condition by controlling the second set of switching devices 122. Each switching device of the second set of switching devices 122 is configured to electrically connect or electrically disconnect each LED of LEDs 112 with second power source 124. In some cases, to disable the set of the LEDs which processing circuitry 102 determines as being associated with the bright failure condition, processing circuitry 102 may turn on each switching device of the second set of switching devices 122 which is electrically connected to an LED of LEDs 112 which processing circuitry 102 determines as being associated with the bright failure condition. As such, the second set of switching devices 122 may electrically connect second power source 124 to the set of the LEDs associated with the bright failure condition.

Second power source 124 may apply a voltage to the set of the LEDs associated with the bright failure condition in order to permanently disable the set of the LEDs associated with the bright failure condition. In some examples, second power source 124 may apply the voltage in order to disable the set of the LEDs individually (e.g., one at a time). In some examples, second power source 124 may apply the voltage in order to disable each LED of the set of the LEDs at the same time. In any case, processing circuitry 102 may convert LEDs associated with the bright failure into LEDs associated with the dark failure by permanently disabling these LEDs such that they are incapable of emitting photons.

In some examples, processing circuitry 102 may determine that one or more LEDs of LEDs 112 is associated with a low-light failure condition. For example, processing circuitry 102 may turn on all of the first set of switching devices 116 and turn on all of the third set of switching devices 132 and generate a sense signal. Subsequently, processing circuitry 102 may determine, based on the sense signal, a set of LEDs of LEDs 112 associated with the low-light failure condition. The low-light failure condition may represent a condition in which an LED gives off light but does not give off as much light as one or more other LEDs which are not associated with the low-light failure condition. It may be beneficial to disable LEDs which are associated with the low-light failure condition so that each LED of LEDs 112 which is turned on emits a uniform level of light. Processing circuitry 102 may control the second set of switching devices 122 in order to disable the set of LEDs which are associated with the low-light failure condition. Additionally, or alternatively, processing circuitry 102 may identify a set of LEDs which are associated with a dark failure condition.

The system of FIG. 1 may represent a "low-side" configuration where the LEDs 112 are placed between first power source 104 and the first set of switching devices 116. A "high-side" configuration may also be possible, with switching devices placed between a power source and a set of LEDs.

Figure 2A:
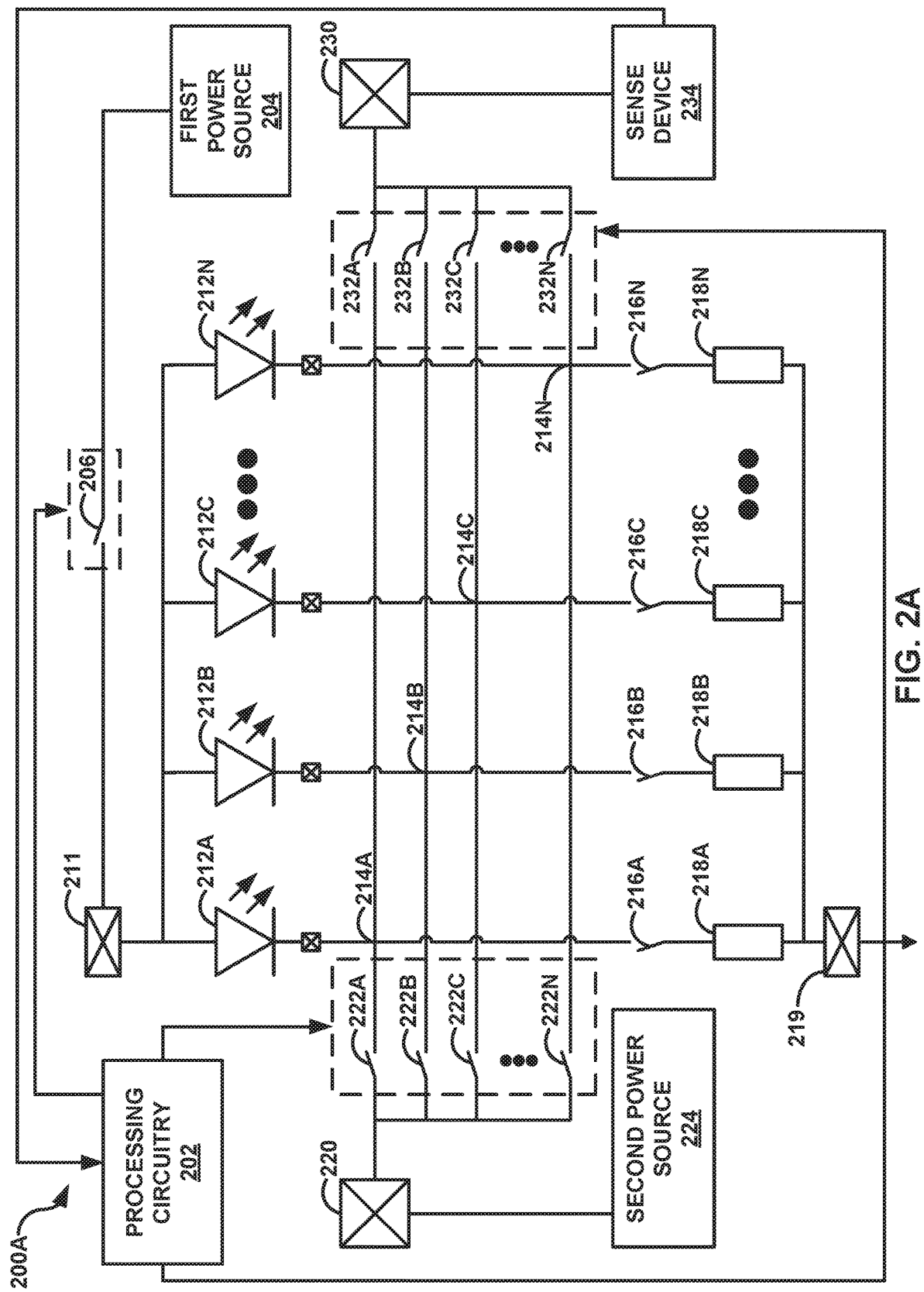
FIG. 2A is a circuit diagram which illustrates a system for testing for one or more failure conditions, in accordance with one or more techniques of this disclosure.

FIG. 2A is a circuit diagram which illustrates a system 200A for testing LEDs 212A-212N for one or more failure conditions, in accordance with one or more techniques of this disclosure. As seen in FIG. 2A, system 200A includes processing circuitry 202, first power source 204, power supply switch 206, LEDs 212A-212N (collectively, "LEDs 212"), nodes 214A-214N (collectively, "nodes 214"), first set of switching devices 216A-216N (collectively, "switching devices 216"), internal elements 218A-218N (collectively, "internal elements 218"), ground pin 219, force pin 220, second set of switching devices 222A-222N (collectively, "switching devices 222"), second power source 224, sense pad 230, third set of switching devices 232A-232N (collectively, "switching devices 232"), and sense device 234. Processing circuitry 202 may be an example of processing circuitry 102 of FIG. 1. First power source 204 may be an example of first power source 104 of FIG. 1. Power supply switch 206 may be an example of power supply switch 106 of FIG. 1. LEDs 212 may be an example of LEDs 112 of FIG. 1. Nodes 214 may be an example of nodes 114 of FIG. 1. The first set of switching devices 216 may be an example of the first set of switching devices 116 of FIG. 1. The second set of switching devices 222 may be an example of the second set of switching devices 122 of FIG. 1. The second power source 224 may be an example of the second power source 124 of FIG. 1. The third set of switching devices 232 may be an example of the third set of switching devices 132 of FIG. 1. Sense device 234 may be an example of sense device 134 of FIG. 1.

Switching devices 116, switching devices 222, and switching devices 232 may form a switch matrix which controls whether each LED of LEDs 112 receives power from first power source 204, controls whether second power source 224 delivers a force signal to each LED of LEDs 112, and controls whether sense device 234 receives an output electrical signal from each LED of LEDs 112. For example, each node of nodes 214 may electrically connect an LED of LEDs 212 with a respective one of switching devices 216, a respective one of switching devices 222, and a respective one of switching devices 232. Node 214A electrically connects LED 212A, switching device 216A, switching device 222A, and switching devices 232A. Node 214B electrically connects LED 212B, switching device 216B, switching device 222B, and switching devices 232B. Node 214C electrically connects LED 212C, switching device 216C, switching device 222C, and switching devices 232C. Node 214N electrically connects LED 212N, switching device 216N, switching device 222N, and switching devices 232N.

Processing circuitry 202 may test each LED of LEDs 212 in order to determine whether the respective LED is associated with a bright failure condition (e.g., the LED emits light while it is meant to be turned off). For example, LED 212B may be associated with a bright failure condition. Processing circuitry 202 may turn off switching device 216B which controls whether LED 212B receives an electrical current from first power source 204. In one or more examples where LED 212B is associated with a bright failure condition, one or more short connections (not illustrated in FIG. 2A) may cause an electrical current to flow across LED 212B even while switching device 216B is turned off, causing LED 212B to emit light while processing circuitry 202 attempts to prevent LED 212B from emitting light by turning off switching device 216B. Processing circuitry 202 may test LED 212B and each other LED of LEDs 212 to determine a set of LEDs which are associated with a bright failure condition.

In some examples, to test each LED of LEDs 212 for a bright failure condition, processing circuitry 202 may turn off each switching device of switching devices 216 in order to attempt to prevent electrical current from flowing through LEDs 212 to ground pin 219. Additionally, in some cases, processing circuitry 202 may turn on each switching device of switching devices 232N, allowing sense device 234 to detect an electrical signal corresponding to each LED of LEDs 212. The electrical signal corresponding to each LED of LEDs 212 may indicate an amount of electrical current flowing through each LED of LEDs 212. For example, the electrical signal corresponding to each LED of LEDs 212 may indicate if there is no electrical current flowing through each respective LED of LEDs 212 and the electrical signal corresponding to each LED of LEDs 212 may indicate if there is at least some electrical current flowing through each respective LED of LEDs 212. When switching devices 232A-232N are turned on and switching devices 216A-216N are turned off, sense device 234 may output the electrical signal corresponding to each LED of LEDs 212A-212N to processing circuitry 202, allowing processing circuitry 202 to determine the amount of electrical current flowing through each LED of LEDs 212.

Processing circuitry 202 may determine that each LED of LEDs 212 in which greater than a threshold amount of electrical current is flowing through the respective LED is associated with the bright failure condition. In some examples, the threshold amount of electrical current may be zero Microampers (µA) or very close to zero µA (e.g., less than 1 µA). In this way, if more than a trace level of electrical current is flowing an LED of LEDs 212 while the respective switching device of switching devices 216 is turned off, processing circuitry 202 may determine that the LED is associated with the bright failure condition. In some examples, the threshold amount of electrical current may be greater than 30 µA. In some examples, the threshold amount of electrical current may be greater than 100 µA. In some examples, the threshold amount of electrical current may be within a range from 15 µA to 150 µA. In this way, a significant amount of electrical current must be flowing though an LED before processing circuitry 202 determines that the LED is associated with the bright failure condition.

In some examples, processing circuitry may test each LED of LEDs 212 in order to determine whether the LED is associated with the bright failure condition during one window of time. For example, sense device 234 may receive the electrical signal corresponding to each LED of LEDs 212 at one time. In some examples, processing circuitry may test each LED of LEDs 212 for the bright failure condition in staggered intervals (e.g., one at a time, two at a time, or any other combination). For example, processing circuitry 202 may turn off switching device 216A and turn on switching device 232A, allowing processing circuitry 202 to test LED 212A for the bright failure condition. Subsequently, processing circuitry 202 may turn off switching device 216B and turn on switching device 232B, allowing processing circuitry 202 to test LED 212B for the bright failure condition, and then processing circuitry 202 may turn off switching device 216C and turn on switching device 232C, allowing processing circuitry 202 to test LED 212C for the bright failure condition, and so on.

In some examples, it may be beneficial to convert LEDs associated with the bright failure condition into LEDs associated with a dark failure condition by permanently preventing the LEDs associated with the bright failure condition from emitting light. This is because in some cases, LEDs 212 may form a matrix, sometimes processing circuitry 202 may attempt to shut off every LED in the matrix. If some LEDs continue to emit light when processing circuitry 202 outputs a comment to turn off all the LEDs, the LED matrix may appear to be emitting a few specks of light, which is not ideal. Processing circuitry 202 may determine a set of LEDs of LEDs 212 which are associated with the bright failure condition. In some examples, the set of LEDs may include LED 212B. Subsequently, processing circuitry 202 may disable each LED of the set of LEDs associated with the bright failure condition.

Processing circuitry 202 may, responsive to determining the LED 212B is associated with the bright failure condition, disable LED 212B. For example, processing circuitry 202 may turn on switching device 222B, electrically connecting second power source 224 with LED 212B via node 214B. In turn, second power source 224 may deliver a force electrical signal to a cathode of LED 212B. In some examples, if one or more parameters of the force electrical signal delivered to the cathode of an LED of LEDs 212 is greater than a threshold parameter value, the force electrical signal may disable the LED. For example, the force electrical signal may represent a 4V electrical signal. This 4V signal may disable an LED when applied to the cathode of the respective LED.

In some examples, processing circuitry may perform one or more tests in order to determine whether each LED of LEDs 112 is associated with the dark failure condition and/or a low light failure condition. For example, in order to test whether an LED of LEDs 212 (e.g., LED 212A) is associated with the dark failure condition, processing circuitry 202 may turn on switching device 216A, creating a connection between first power source 204 and ground pin 219 through LED 212A. Processing circuitry 202 may turn on switching device 232A so that sense device 234 may detect an electrical signal indicating an amount of electrical current flowing through LED 212A. If less than a threshold amount of electrical current is flowing through LED 212A while switching device 216A is turned on, processing circuitry 202 may determine that LED 212A is associated with the dark failure condition. In some examples, the threshold amount of electrical current may be zero µA or very close to zero µA (e.g., less than 1 µA). In this way, if no electrical current or nearly no electrical current is flowing through LED 212A while switching device 216A is turned on, processing circuitry 202 may determine that LED 212A is associated with the dark failure condition.

In order to test whether an LED of LEDs 212 (e.g., LED 212C) is associated with the low-light failure condition, processing circuitry 202 may turn on switching device 216C, creating a connection between first power source 204 and ground pin 219 through LED 212C. Processing circuitry 202 may turn on switching device 232C so that sense device 234 may detect an electrical signal indicating an amount of electrical current flowing through LED 212C. When the amount of electrical current flowing through LED 212C while switching device 216A is turned on is within a range from a lower-bound current threshold to an upper-bound current threshold, processing circuitry 202 may determine that LED 212C is associated with the low-light failure condition. In some examples, processing circuitry 202 may disable one or more LEDs which are associated with the low-light failure condition.

Processing circuitry 202 may, responsive to determining the LED 212C is associated with the low-light failure condition, disable LED 212C. For example, processing circuitry 202 may turn on switching device 222C, electrically connecting second power source 224 with LED 212C via node 214C. In turn, second power source 224 may deliver a force electrical signal to a cathode of LED 212C. In some examples, if one or more parameters of the force electrical signal delivered to the cathode of an LED of LEDs 212 is greater than a threshold parameter value, the force electrical signal may disable the LED. For example, the force electrical signal may represent a 4V electrical signal. This 4V signal may disable an LED when applied to the cathode of the respective LED.

Although LED 212A is described as being associated with the dark failure condition, LED 212B is described as being associated with the bright failure condition, and LED 212C is described as being associated with the low-light failure condition, this is not required. Each LED of LEDs 212 may be associated with any one or combination of the failure conditions described herein, or may be associated with none of the failure conditions described herein.

Figure 2B:
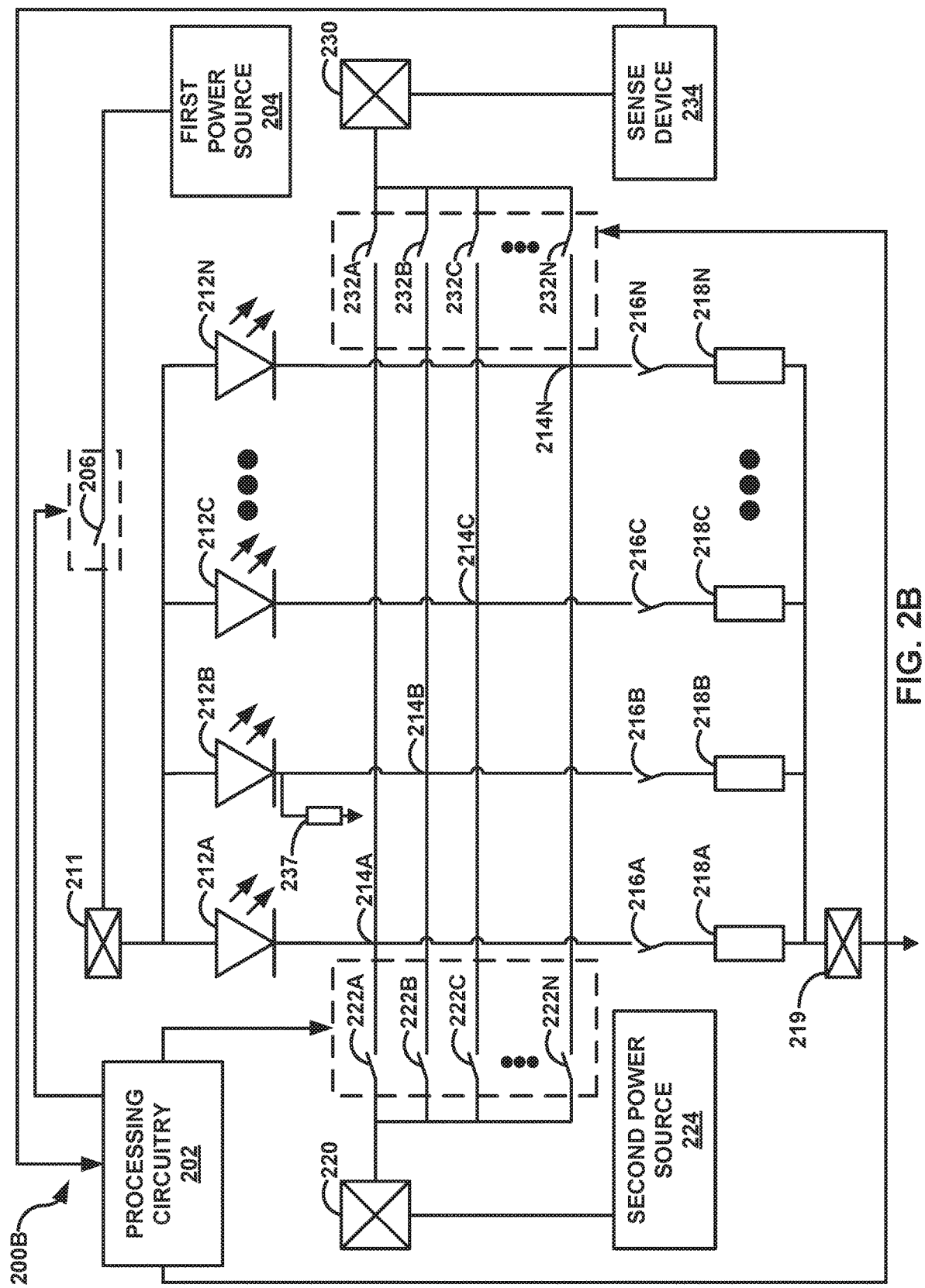
FIG. 2B is a circuit diagram which illustrates a system including a short-to-ground connection, in accordance with one or more techniques of this disclosure.

FIG. 2B is a circuit diagram which illustrates a system 200B including a short-to-ground connection 237, in accordance with one or more techniques of this disclosure. In some examples, system 200B may be substantially the same as system 200A, except that LED 212B is connected to a short-to-ground connection 237 which creates a path from first power source 204 to ground through LED 212B. As such, when processing circuitry 202 turns off switching device 216B, processing circuitry 202 may break a connection between first power source 204 and ground pin 219 through LED 212B. However, since short-to-ground connection 237 creates a path to ground through LED 212B, LED 212B may continue to emit light while switching device 216B is turned off. As such, LED 212B may be associated with the bright failure condition.

In some examples, it may be beneficial to permanently disable LED 212B in order to prevent LED 212B from continuing to emit light while proximate LEDs within a matrix are turned off. Permanently disabling LED 212B may solve a problem of having a speck of light in a matrix of LEDs which are mostly turned off. In some examples, processing circuitry 202 may set voltage input pin 211 to zero Volts (V) and allow ground pin 219 to float. In some examples, processing circuitry 202 may turn off an internal anti-leakage setting of system 200B. Processing circuitry 202 may cause second power source 224 to deliver a force electrical signal which includes a predetermined force voltage (e.g., 4V) to force pin 220. Additionally, processing circuitry may determine that LED 212B is associated with the bright failure condition and turn on switching device 222B, creating an electrical connection between force pin 220 and the cathode of LED 212B. As such, force pin 220 applies the force voltage to the cathode of LED 212B, permanently disabling (e.g., destroying) LED 212B without damaging LED 212A and LEDs 212C-212N. In some examples, the force voltage may be referred to as a "reverse break-down voltage." Alternatively, or additionally, processing circuitry 202 may cause ground pin 219 to receive an electrical signal including the force voltage and set voltage input pin 211 to 0V. Processing circuitry 202 may turn on switching device 216B and turn off switching device 216A and 216C-216N so that ground pin 219 delivers the force voltage to the cathode of LED 212B without damaging LED 212A and LEDs 212C-212N. Processing circuitry 202 may perform one or more techniques of this disclosure to permanently disable one or combination of LEDs 112 which processing circuitry 202 identifies as being associated with the bright failure condition.

Figure 2C:
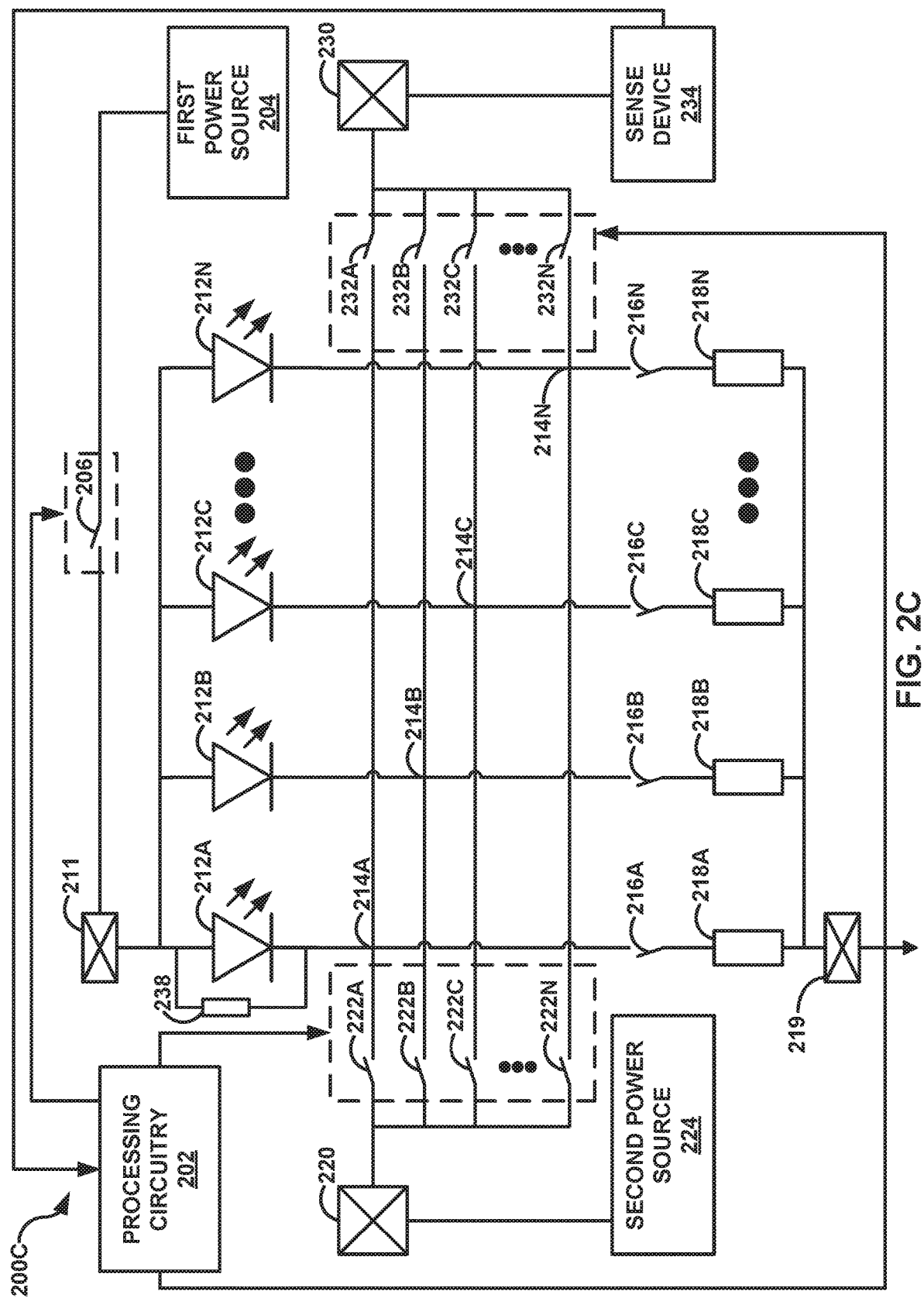
FIG. 2C is a circuit diagram which illustrates a system including a short-to-battery connection, in accordance with one or more techniques of this disclosure.

FIG. 2C is a circuit diagram which illustrates a system 200C including a short-to-battery connection 238, in accordance with one or more techniques of this disclosure. In some examples, system 200C may be substantially the same as system 200A, except that short-to-battery connection 238 creates an electrical path from first power source 204 around LED 212A. As such, when processing circuitry 202 turns on switching device 216A, a portion of an electrical current travelling through switching device 216A from first power source 204 may flow through short-to-battery connection 238, and a portion of the electrical current travelling through switching device 216A may flow through LED 212A. As such, LED 212N might give off more light than LED 212A when processing circuitry 202 turns on switching device 216A and switching device 216N. This is because there may be no short-to-battery connection around LED 212N and an entire electrical current travelling through switching device 216N may first flow through LED 212N. Consequently, LED 212A may be associated with a low-light failure condition.

In some examples, it may be beneficial to permanently disable LED 212A in response to determining that LED 212A is associated with the low-light failure condition. In some examples, processing circuitry 202 may set voltage input pin 211 to zero Volts (V) and allow ground pin 219 to float. In some examples, processing circuitry 202 may turn off an internal anti-leakage setting of system 200C. Processing circuitry 202 may cause second power source 224 to deliver a force electrical signal which includes a predetermined force voltage (e.g., 4V) to force pin 220. Additionally, processing circuitry 202 may turn on switching device 222A, creating an electrical connection between force pin 220 and the cathode of LED 212A. As such, force pin 220 applies the force voltage to the cathode of LED 212A, permanently disabling (e.g., destroying) LED 212A without damaging LEDs 212B-212N. In some examples, the force voltage may be referred to as a "reverse break-down voltage." Alternatively, or additionally, processing circuitry 20 may cause ground pin 219 to receive an electrical signal including the force voltage and set voltage input pin 211 to V. Processing circuitry 202 may turn on switching device 216A and turn off switching devices 216B-216N so that ground pin 219 delivers the force voltage to the cathode of LED 212A without damaging LEDs 212B-212N. Processing circuitry 202 may perform one or more techniques of this disclosure to permanently disable one or combination of LEDs 112 which processing circuitry 202 identifies as being associated with the low-light failure condition.

Figure 2D:
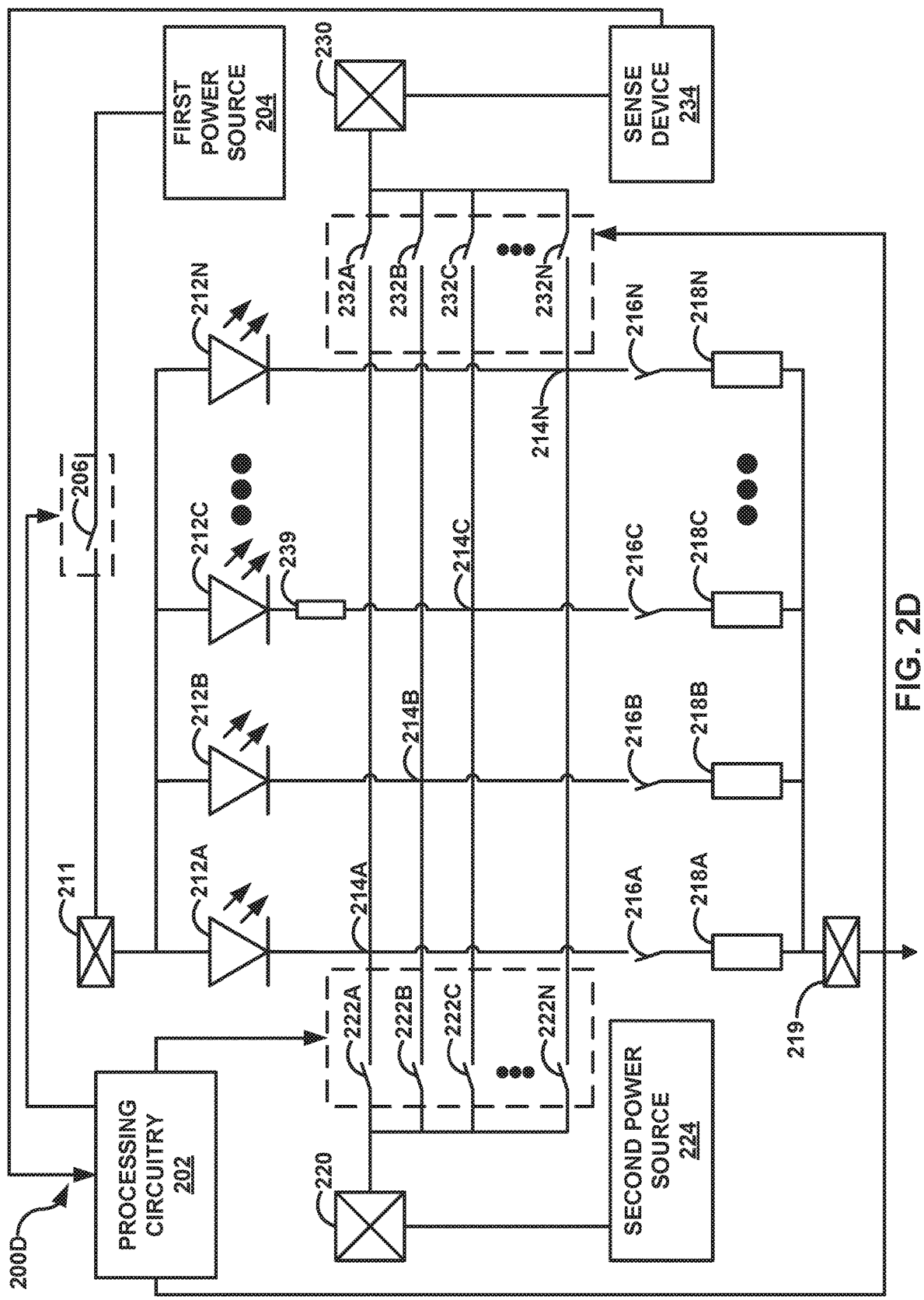
FIG. 2D is a circuit diagram which illustrates a system including a weak connection, in accordance with one or more techniques of this disclosure.

FIG. 2D is a circuit diagram which illustrates a system 200D including a weak connection 239, in accordance with one or more techniques of this disclosure. In some examples, system 200D may be substantially the same as system 200A, except that weak connection 239 causes an increased resistance through LED 212C as compared with one or more other LEDs of LEDs 212. As such, when processing circuitry 202 turns on switching devices 216, less electrical current may flow through LED 212C as compared with one or more other LEDs of LEDs 212, since a path through LED 212C includes a greater resistance than a path through the one or more other LEDs. Consequently, LED 212C may be associated with a low-light failure condition.

In some examples, it may be beneficial to permanently disable LED 212C in response to determining that LED 212C is associated with the low-light failure condition. To disable LED 212C, processing circuitry 202 may turn off power supply switch 206. In some examples, processing circuitry 202 may turn off an internal anti-leakage setting of system 200D. Additionally, processing circuitry 202 may toggle from a current source mode to resistance like mode of system 200D. In other words, processing circuitry 202 may disable LED 212C based on a resistance of a path through each respective LED of LEDs 212. In some examples, processing circuitry 202 may turn LED 212A and increase a current through LED 212A. For example, processing circuitry 202 may apply a force current to input pin 211, permanently disabling LED 212A.

Figure 3A:
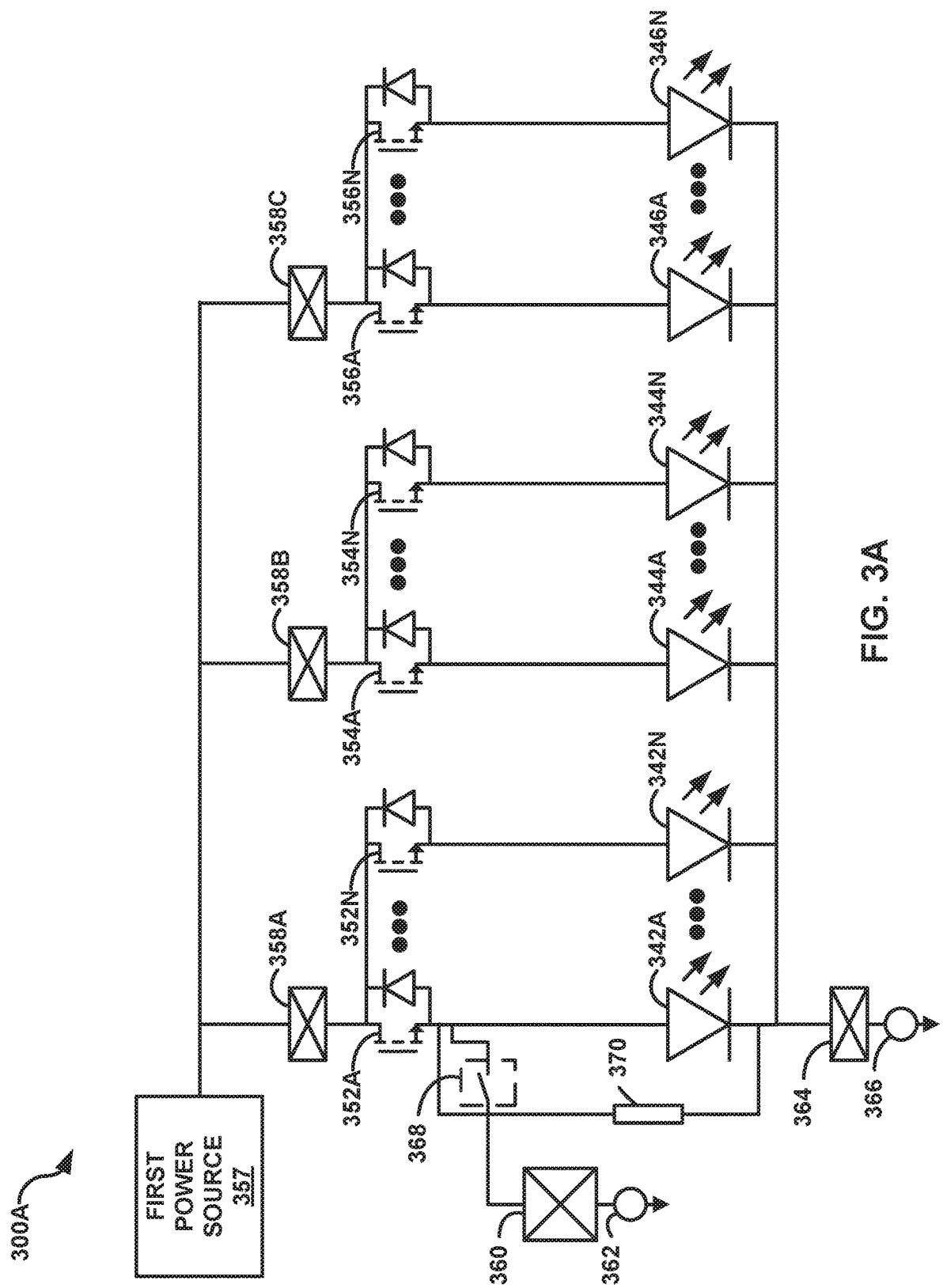
FIG. 3A is a circuit diagram illustrating a high-side configuration of a system for testing LEDs for one or more failure conditions, in accordance with one or more techniques of this disclosure.

FIG. 3A is a circuit diagram illustrating a high-side configuration of a system 300A for testing LEDs for one or more failure conditions, in accordance with one or more techniques of this disclosure. System 300A includes LEDs 342A-342N (collectively, "LEDs 342"), LEDs 344A-344N (collectively, "LEDs 344"), LEDs 346A-346N (collectively, "LEDs 346"), switching devices 352A-352N (collectively, "switching devices 352"), switching devices 354A-354N (collectively, "switching devices 354"), switching devices 356A-356N (collectively, "switching devices 356"), first power source 357, input pins 358A-358C (collectively, "input pins 358"), force pin 360, second power source 362, ground pin 364, third power source 366, switching device 368, and short-to-ground connection 370.

System 300B may represent a high-side configuration where switching devices 352, switching devices, 354, and switching devices 356 (collectively, "switching devices 352, 354, 356") are located between LEDs 342. LEDs 344, and LEDs 346 (collectively, "LEDs 342, 344, 346) and first power source 357. In some examples, processing circuitry (not illustrated in FIG. 3A) may determine whether each LED of LEDs 342, 344, 346 is associated with one or more failure conditions. For example, the processing circuitry may determine that LED 342 is associated with a low-light failure condition. For example, the processing circuitry may determine, based on one or more signals received by a sense device (not illustrated in FIG. 3A) that an electrical current flowing through LED 342A is less than an electrical current threshold due to short-to-ground connection 370. In turn, the processing circuitry may permanently disable LED 342A.

To permanently disable LED 342A, the processing circuitry may set a voltage at ground pin 364 to a predetermined voltage value using third power source 366 and allow the voltage at input pins 358 to float. The processing circuitry may turn off an internal anti-leakage setting of system 300A. In some examples, the processing circuitry may cause second power source 362 to apply a voltage of 0V at force pin 360. Responsive to determining that LED 342A is associated with a low-light failure, the processing circuitry may turn on switching device 368, thus electrically connecting ground pin 364 with force pin 360 through LED 342A. The force differential between ground pin 364 and force pin 360 may permanently disable LED 342A without damaging other LEDs of LEDs 342, 344, 346. Alternatively, in some examples, the processing circuitry may apply a voltage of 0V to input pins 358, and turn on switching device 352, creating an electrical connection between input pin 358A and ground pin 364. In turn, the voltage differential between input pin 358A and ground pin 364 may permanently disable LED 342A.

System 300A may include a switch matrix including a first set of switching devices 352, 354, 356, a second set of switching devices each connecting a respective LED of LEDs 342, 344, 346 with second power source 362, and a third set of switching devices each connecting a respective LED of LEDs 342, 344, 346 with a sense device (not illustrated in FIG. 3A. As such, switching device 368 may be one of the second set of switching devices. The third set of switching devices and the sense device may determine an amount of electrical current flowing through each one of LEDs 342, 344, 346. The second set of switching devices, second power source 362, and third power source 366 may allow the processing circuitry to disable any one or more of LEDs 342, 344, 346.

Figure 3B:
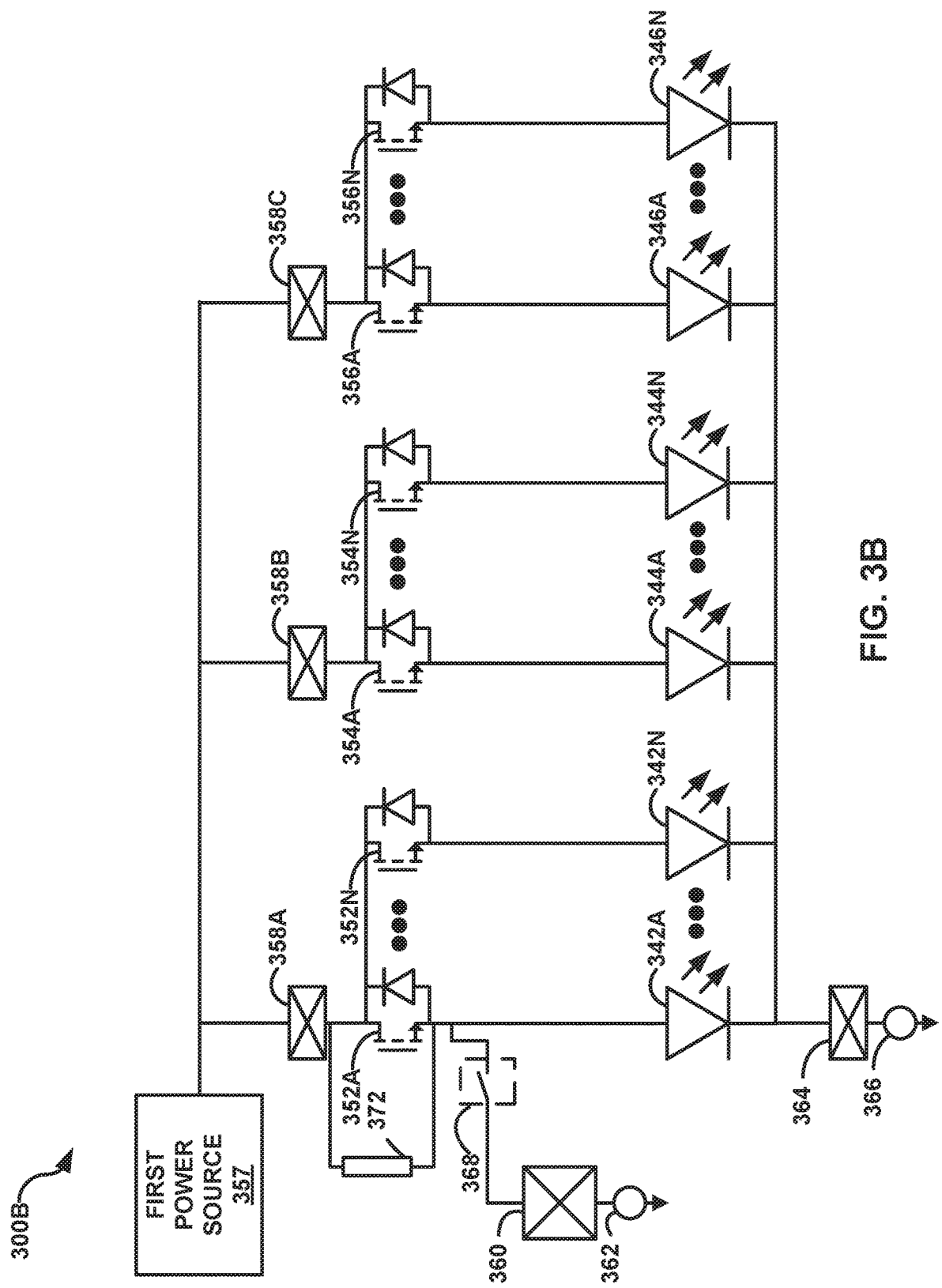
FIG. 3B is a circuit diagram illustrating a high-side configuration of another system for testing LEDs for one or more failure conditions, in accordance with one or more techniques of this disclosure.

FIG. 3B is a circuit diagram illustrating a high-side configuration of another system 300B for testing LEDs for one or more failure conditions, in accordance with one or more techniques of this disclosure. System 300B may be substantially similar to system 300A of FIG. 3A except that system 300B includes a short-to-battery connection 372 which creates a path from input pin 358A around switching device 352A. As such, when processing circuitry (not illustrated in FIG. 3B) turns off switching device 352A, electrical current may flow around switching device 352A through short-to-battery connection 372, causing LED 342A to continue to emit light when switching device 352A is turned off. As such, switching device 352A may be associated with a bright failure condition. It may be beneficial to permanently disable LED 342A responsive to determining that LED 342A is associated with the bright failure condition. The processing circuitry may apply one or more techniques described herein to permanently disable LED 342A.

Figure 4A:
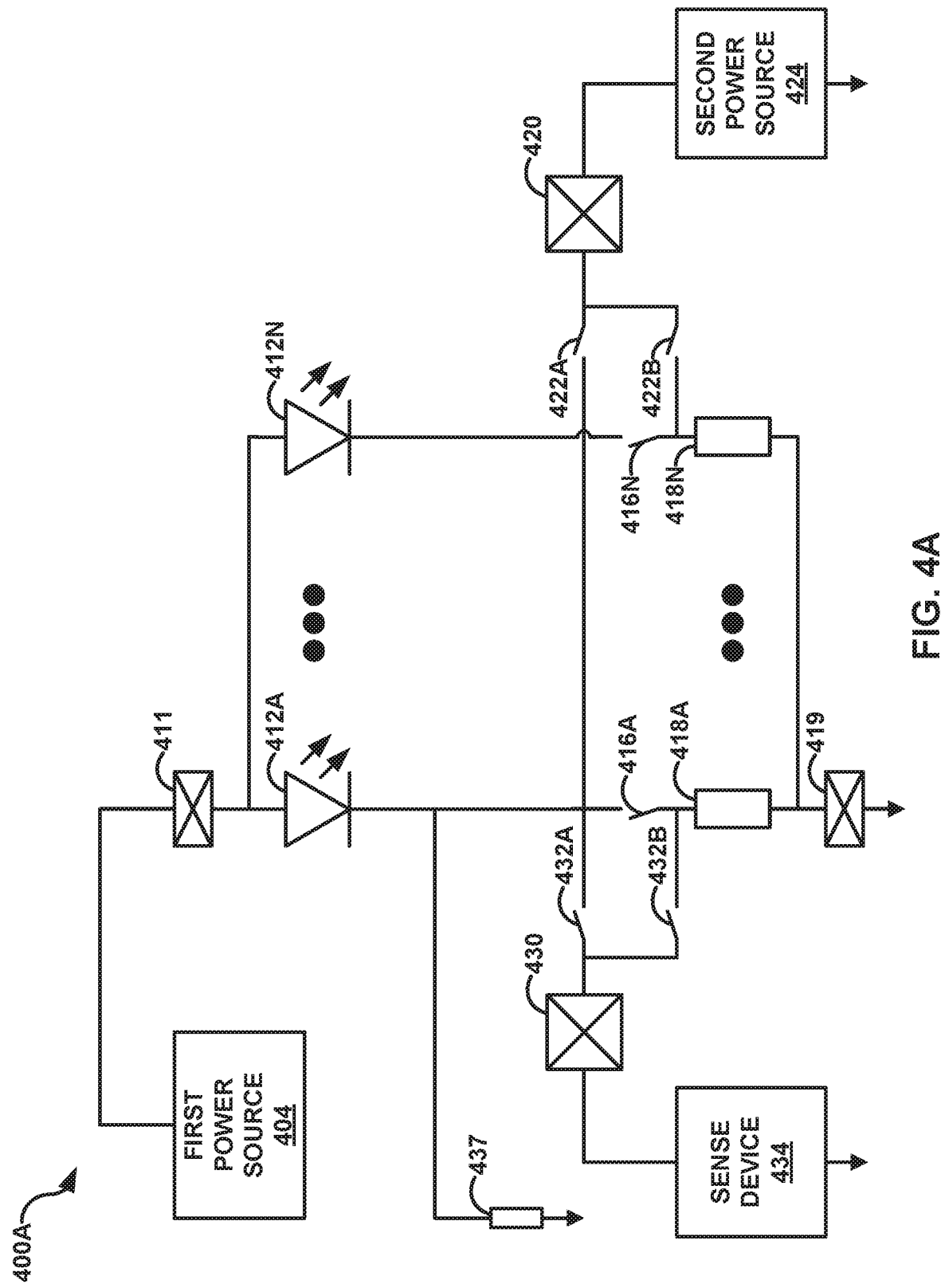
FIG. 4A is a circuit diagram illustrating a system for detecting a bright failure condition caused by a short-to-ground connection, in accordance with one or more techniques of this disclosure.

FIG. 4A is a circuit diagram illustrating a system 400A for detecting a bright failure condition caused by a short-to-ground connection 437, in accordance with one or more techniques of this disclosure. System 400A includes first power source 404, input pin 411. LEDs 412A-412N (collectively, "LEDs 412"), switching devices 416A-416N (collectively, "switching devices 416"), internal elements 418A-418N (collectively, "internal elements 418"), ground pin 419, force pin 420, switching devices 422A-422N (collectively, "switching devices 422"), second power source 424, sense pin 430, switching devices 432A-432N (collectively, "switching devices 432"), and sense device 434.

In some examples, to detect one or more LEDs of LEDs 412 which are associated with the bright failure condition, processing circuitry (not illustrated in FIG. 4A) is configured to turn off each switching device of switching devices 416. Subsequently, the processing circuitry may select an LED in which to test for the bright failure condition. When the processing circuitry selects LED 412A, for example, the processing circuitry may turn on switching devices 432A so that LED 412A and sense pin 430 are electrically connected. As such, sense device 434 may detect an amount of current or an amount of voltage output from LED 412A. If the amount of current and/or the amount of voltage output from LED 412A is zero or nearly zero, the processing circuitry may determine that LED 412A is associated with the bright failure condition. If the voltage output from LED 412A matches the voltage at input pin 411, the processing circuitry may determine that LED 412A is not associated with the bright failure condition. Second power source 424 may apply a force voltage to permanently disable Led 412A responsive to determining that LED 412A is associated with the bright failure condition. In some examples, input pin 411 is set to a predetermined voltage (e.g., 5V). In some examples, an amount of electrical current flowing through an LED that is not associated with a failure condition is within a range from 30 μA to 70 μA (e.g., 50 μA).

Figure 4B:
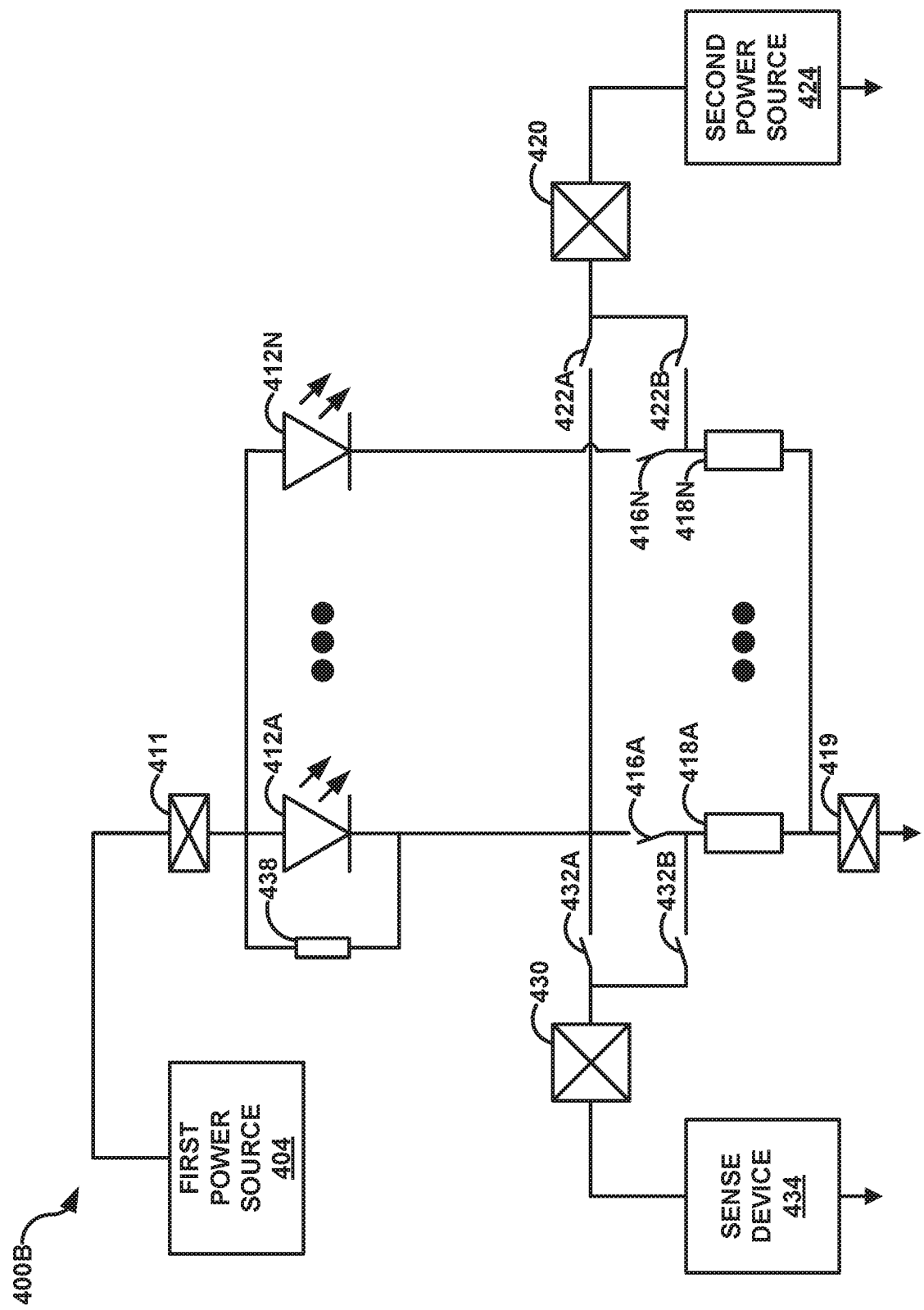
FIG. 4B is a circuit diagram illustrating a system for detecting a bright failure condition caused by a short-to-battery connection, in accordance with one or more techniques of this disclosure.

FIG. 4B is a circuit diagram illustrating a system 400B for detecting a bright failure condition caused by a short-to-battery connection 438, in accordance with one or more techniques of this disclosure. System 400B may be substantially similar to system 400A of FIG. 4A except that system 400B includes short-to-battery connection 438, causing LED 412A to be associated with the low-light failure condition. Processing circuitry (not illustrated in FIG. 4B) may determine that LED 412A is associated with the low-light failure condition based on one or more sense signals detected by sense device 434. In some examples, second power source 424 may cause a force electrical current to flow through LED 412A and force pin 420, permanently disabling LED 412A. The force electrical current, in some cases, may be within a range from 50 μA to 150 μA (e.g., 100 μA).

Figure 4C:
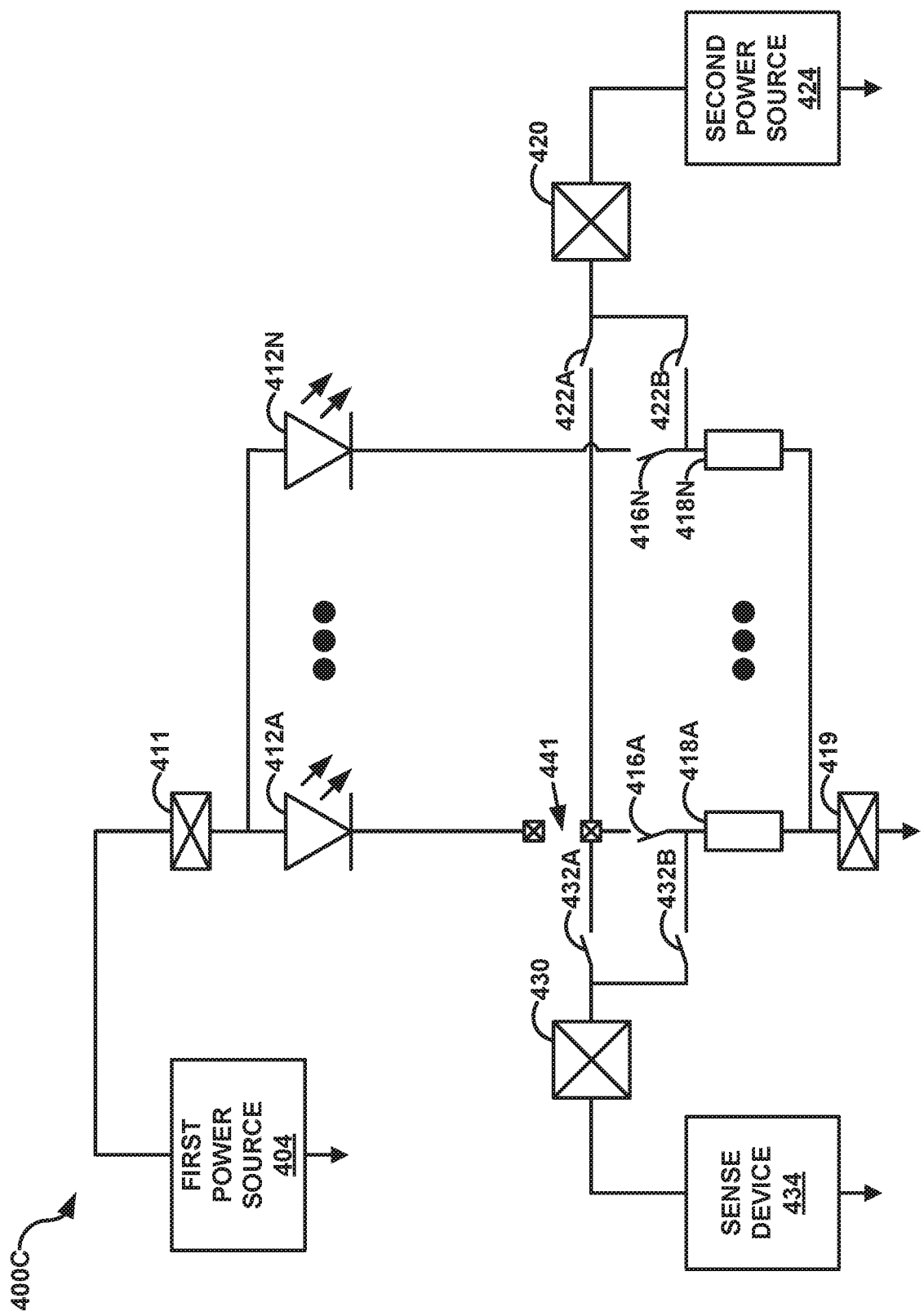
FIG. 4C is a circuit diagram illustrating a system for detecting a dark failure condition caused by an open connection, in accordance with one or more techniques of this disclosure.

FIG. 4C is a circuit diagram illustrating a system 400C for detecting a dark failure condition caused by an open connection 441, in accordance with one or more techniques of this disclosure. System 400C may be substantially similar to system 400A of FIG. 4A except that system 400C includes open connection 441, causing LED 412A to be associated with the dark failure condition. Processing circuitry (not illustrated in FIG. 4C) may determine that LED 412A is associated with the dark failure condition based on one or more sense signals detected by sense device 434. In some examples, second power source 424 may cause a force electrical current to flow through LED 412A and force pin 420, permanently disabling LED 412A. The force electrical current, in some cases, may be within a range from 10 μA to 50 μA (e.g., 20 μA). In some examples, the force electrical current of system 400C may lower than an anti-leakage current of 50 μA.

Figure 4D:
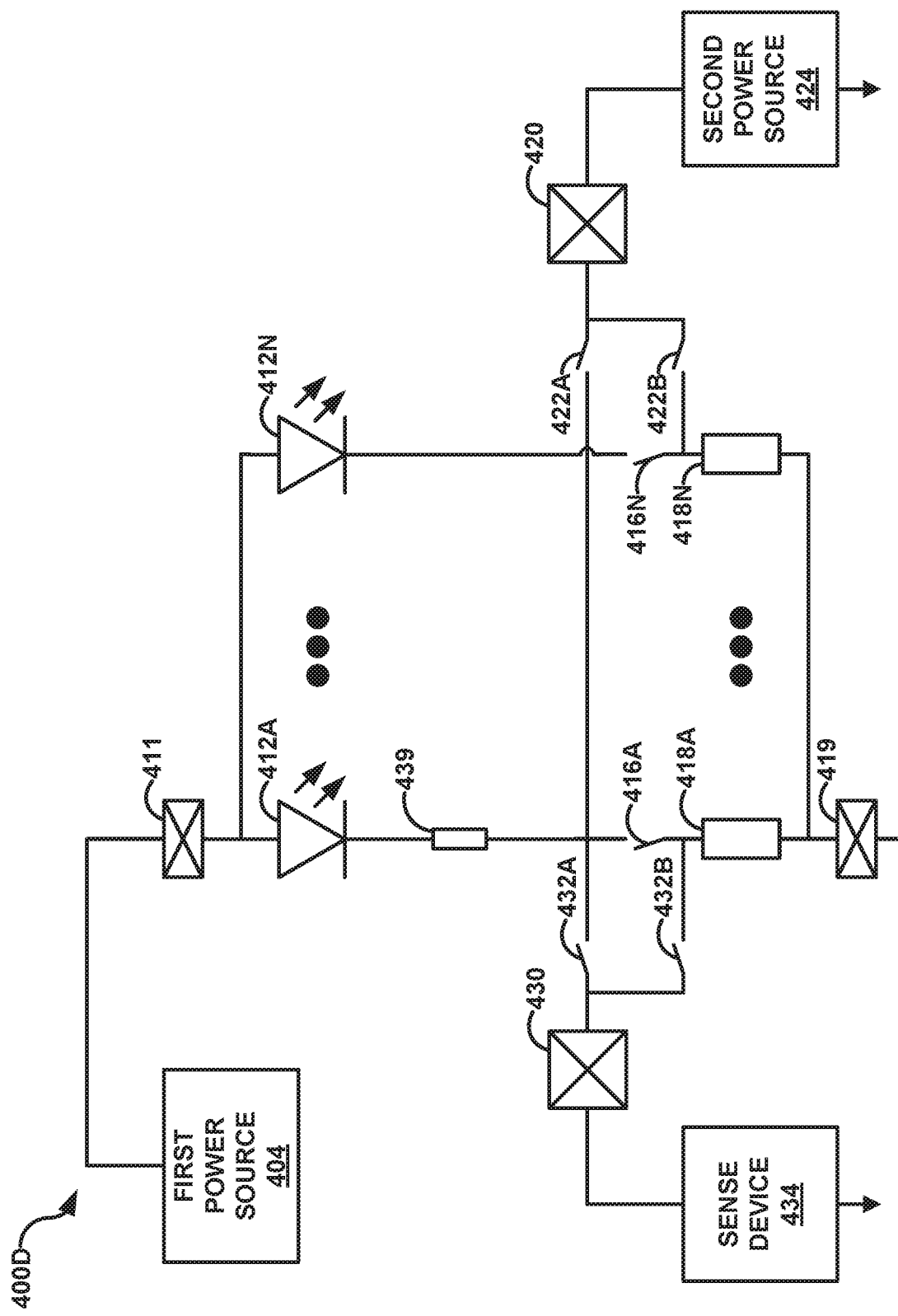
FIG. 4D is a circuit diagram illustrating a system for detecting a low-light failure condition caused by a weak connection, in accordance with one or more techniques of this disclosure.

FIG. 4D is a circuit diagram illustrating a system 400D for detecting a low-light failure condition caused by a weak connection 439, in accordance with one or more techniques of this disclosure. System 400D may be substantially similar to system 400A of FIG. 4A except that system 400D includes weak connection 449, causing LED 412A to be associated with the low-light failure condition. Processing circuitry (not illustrated in FIG. 4D) may determine that LED 412A is associated with the low-light failure condition based on one or more sense signals detected by sense device 434. In some examples, second power source 424 may cause a force electrical current to flow through LED 412A and force pin 420, permanently disabling LED 412A. The force electrical current, in some cases, may be within a range from 10 μA to 50 μA (e.g., 20 μA). In some examples, the force electrical current of system 400D may lower than an anti-leakage current of 50 μA.

Figure 5:
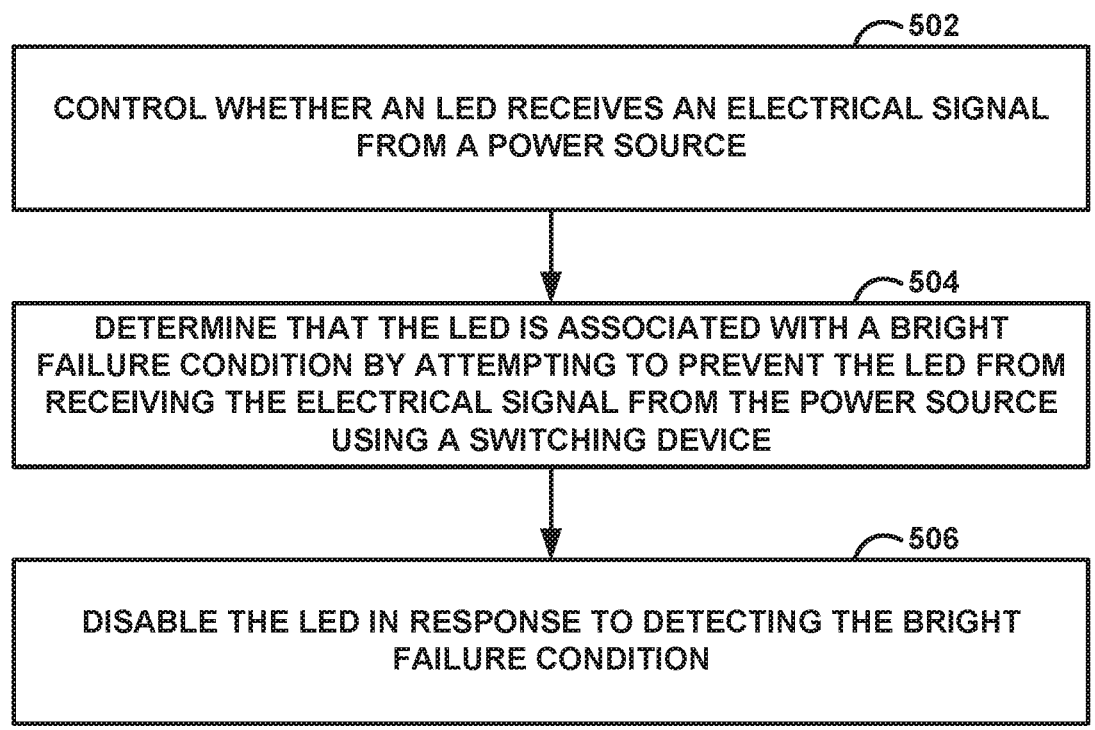
FIG. 5 is a flow diagram illustrating an example operation for identifying one or more LEDs associated with a bright failure condition, in accordance with one or more techniques of this disclosure.

FIG. 5 is a flow diagram illustrating an example operation for identifying one or more LEDs associated with a bright failure condition, in accordance with one or more techniques of this disclosure. FIG. 5 is described with respect to system 100 of FIG. 1. However, the techniques of FIG. 5 may be performed by different components of system 100 or by additional or alternative systems.

Processing circuitry 102 may control whether an LED of LEDs 112 receives an electrical signal from first power source 104 (502). For example, processing circuitry 102 may turn off a switching device of switching devices 116, breaking a connection between first power source 104 and ground. Processing circuitry 102 may determine that the LED is associated with a bright failure condition by attempting to prevent the LED form receiving the electrical signal from first power source 104 (504). For example, by turning off the switching device of switching devices 116 which corresponds to the LED, processing circuitry 102 may be attempting to prevent the LED form emitting light. Subsequently, processing circuitry disables the LED in response to detecting the bright failure condition (506). In some examples, processing circuitry 102 disables the LED by applying a force voltage to a cathode of the LED using second power source 124.

The following numbered examples demonstrate one or more aspects of the disclosure.

Example 1. A circuit for controlling a plurality of LEDs, the circuit comprising: a switching device, wherein the switching device is electrically connected to an LED of the plurality of LEDs, and wherein the switching device is configured to control whether the LED receives an electrical signal from a power source; and processing circuitry configured to: determine that the LED is associated with a bright failure condition by attempting to prevent the LED from receiving the electrical signal from the power source using the switching device; and disable the LED in response to detecting the bright failure condition.

Example 2. The circuit of example 1, wherein the switching device is one of a set of switching devices, wherein each switching device of the set of switching devices is electrically connected to a respective LED of the plurality of LEDs, and wherein the processing circuitry is further configured to: determine that at least one other LED of the plurality of LEDs is associated with the bright failure condition by attempting to prevent the LED from receiving the electrical signal from the power source using respective switching devices of the set of switching devices; and disable the at least one other LED in response to detecting the bright failure condition.

Example 3. The circuit of examples 1-2 or any combination thereof, wherein the power source is a first power source, wherein the electrical signal is a first electrical signal, wherein the circuit further comprises a node configured to receive a second electrical signal from a second power source, and wherein to disable the LED, the processing circuitry is configured to cause the node to deliver the second electrical signal to the LED in order to permanently prevent the LED from emitting photons.

Example 4. The circuit of examples 1-3 or any combination thereof, wherein the switching device is a first switching device, wherein the circuit further comprises a second switching device electrically connected to the LED, and wherein to cause the node to deliver the second electrical signal to the LED, the processing circuitry is configured to turn on the second switching device, causing the second power source to deliver the second electrical signal to the LED via the node.

Example 5. The circuit of examples 1-4 or any combination thereof, wherein a cathode of the LED is electrically connected to the first switching device, wherein the cathode of the LED is electrically connected to the second switching device, and wherein to cause the node to deliver the second electrical signal to the LED, the processing circuitry is configured to cause the node to deliver the second electrical signal to the cathode of the LED, wherein the second electrical signal includes a voltage within a range from a safe operating voltage of the LED and a breakdown voltage of the LED.

Example 6. The circuit of examples 1-5 or any combination thereof, wherein an anode of the LED is electrically connected to the first switching device, wherein the anode of the LED is electrically connected to the second switching device, and wherein to cause the node to deliver the second electrical signal to the LED, the processing circuitry is configured to cause the node to deliver the second electrical signal to the anode of the LED, wherein the second electrical signal includes a voltage of 0V.

Example 7. The circuit of examples 1-6 or any combination thereof, wherein the node is a first node, and wherein the circuit further comprises: a second node; and a third switching device electrically connected to the LED, and wherein to determine that the LED is associated with the bright failure condition, the processing circuitry is configured to: turn off the first switching device; turn on the third switching device in order to deliver a third electrical signal from the LED to the second node; receive, from a sense device electrically connected to the second node, a sense signal which identifies that the LED conducts electricity while the first switching device is turned off; and determine, based on the sense signal, that the LED is associated with a bright failure condition.

Example 8. The circuit of examples 1-7 or any combination thereof, wherein the LED is a first LED, and wherein the processing circuitry is further configured to determine that a second LED of the plurality of LEDs is associated with a dark failure condition.

Example 9. The circuit of examples 1-8 or any combination thereof, wherein the processing circuitry is further configured to: determine that a third LED of the plurality of LEDs is associated with a low-light failure condition; and disable the third LED in response to detecting the low-light failure condition.

Example 10. The circuit of examples 1-9 or any combination thereof, wherein to determine that the third LED is associated with a low-light failure condition, the processing circuitry is configured to: identify an output voltage value corresponding to the third LED; determine whether the output voltage value corresponding to the third LED is less than a threshold output voltage value; and determine that third LED is associated with a low-light failure condition based on the output voltage value of the third LED being less than the threshold output voltage value.

Example 11. A method for controlling a plurality of LEDs, the method comprising: controlling whether an LED of the plurality of LEDs receives an electrical signal from a power source; determining, by processing circuitry, that the LED is associated with a bright failure condition by attempting to prevent the LED from receiving the electrical signal from the power source using a switching device, wherein the switching device is electrically connected to the LED; and disabling, by the processing circuitry, the LED in response to detecting the bright failure condition.

Example 12. The method of example 11, wherein the switching device is one of a set of switching devices, wherein each switching device of the set of switching devices is electrically connected to a respective LED of the plurality of LEDs, and wherein the method further comprises: determining that at least one other LED of the plurality of LEDs is associated with the bright failure condition by attempting to prevent the LED from receiving the electrical signal from the power source using respective switching devices of the set of switching devices; and disabling the at least one other LED in response to detecting the bright failure condition.

Example 13. The method of examples 11-12 or any combination thereof, wherein the power source is a first power source, wherein the electrical signal is a first electrical signal, the method further comprising: receiving, by a node, a second electrical signal from a second power source, and wherein disabling the LED comprises: causing the node to deliver the second electrical signal to the LED in order to permanently prevent the LED from emitting photons.

Example 14. The method of examples 11-13 or any combination thereof, wherein the switching device is a first switching device, wherein a second switching device is electrically connected to the LED, and wherein causing the node to deliver the second electrical signal to the LED comprises turning on, by the processing circuitry, the second switching device, causing the second power source to deliver the second electrical signal to the LED via the node.

Example 15. The method of examples 11-14 or any combination thereof, wherein a cathode of the LED is electrically connected to the first switching device, wherein the cathode of the LED is electrically connected to the second switching device, and wherein causing the node to deliver the second electrical signal to the LED comprises causing the node to deliver the second electrical signal to the cathode of the LED, wherein the second electrical signal includes a voltage within a range from a safe operating voltage of the LED and a breakdown voltage of the LED.

Example 16. The method of examples 11-15 or any combination thereof, wherein an anode of the LED is electrically connected to the first switching device, wherein the anode of the LED is electrically connected to the second switching device, and wherein causing the node to deliver the second electrical signal to the LED comprises causing the node to deliver the second electrical signal to the anode of the LED, wherein the second electrical signal includes a voltage of 0V.

Example 17. The method of examples 11-16 or any combination thereof, wherein determining that the LED is associated with the bright failure condition comprises: turning off the first switching device, turning on a third switching device in order to deliver a third electrical signal from the LED to a second node, wherein the third switching device is electrically connected to the LED; receiving, from a sense device electrically connected to the second node, a sense signal which identifies that the LED conducts electricity while the first switching device is turned off; and determining, based on the sense signal, that the LED is associated with a bright failure condition.

Example 18. The method of examples 11-17 or any combination thereof, wherein the LED is a first LED, and wherein the method further comprises determining, by the processing circuitry, that a second LED of the plurality of LEDs is associated with a dark failure condition.

Example 19. The method of examples 11-18 or any combination thereof, further comprising: determining, by the processing circuitry, that a third LED of the plurality of LEDs is associated with a low-light failure condition; and disabling the third LED in response to detecting the low-light failure condition.

Example 20. A system for controlling a plurality of LEDs, the circuit comprising: the plurality of LEDs; a switching device, wherein the switching device is electrically connected to an LED of the plurality of LEDs, and wherein the switching device is configured to control whether the LED receives an electrical signal from a power source; and processing circuitry configured to: determine that the LED is associated with a bright failure condition by attempting to prevent the LED from receiving the electrical signal from the power source using the switching device; and disable the LED in response to detecting the bright failure condition.

Various examples of the disclosure have been described. These and other examples are within the scope of the following claims.

What is claimed is:

1. A circuit for controlling a plurality of light emitting diodes (LEDs), the circuit comprising:
   a switching device, wherein the switching device is electrically connected to an LED of the plurality of LEDs, and wherein the switching device is configured to control whether the LED receives a first electrical signal from a first power source;
   a node configured to receive a second electrical signal from a second power source; and
   processing circuitry configured to:
      determine that the LED is associated with a bright failure condition by attempting to prevent the LED from receiving the first electrical signal from the first power source using the switching device; and
      disable the LED in response to detecting the bright failure condition wherein to disable the LED, the processing circuitry is configured to cause the node to deliver the second electrical signal to the LED in order to permanently prevent the LED from emitting photons.

2. The circuit of claim 1, wherein the switching device is one of a set of switching devices, wherein each switching device of the set of switching devices is electrically connected to a respective LED of the plurality of LEDs, and wherein the processing circuitry is further configured to:
   determine that at least one other LED of the plurality of LEDs is associated with the bright failure condition by attempting to prevent the LED from receiving the first electrical signal from the first power source using respective switching devices of the set of switching devices; and
   disable the at least one other LED in response to detecting the bright failure condition.

3. The circuit of claim 1, wherein the switching device is a first switching device, wherein the circuit further comprises a second switching device electrically connected to the LED, and wherein to cause the node to deliver the second electrical signal to the LED, the processing circuitry is configured to turn on the second switching device, causing the second power source to deliver the second electrical signal to the LED via the node.

4. The circuit of claim 3, wherein a cathode of the LED is electrically connected to the first switching device, wherein the cathode of the LED is electrically connected to the second switching device, and wherein to cause the node to deliver the second electrical signal to the LED, the processing circuitry is configured to cause the node to deliver the second electrical signal to the cathode of the LED, wherein the second electrical signal includes a voltage within a range from a safe operating voltage of the LED and a breakdown voltage of the LED.

5. The circuit of claim 3, wherein an anode of the LED is electrically connected to the first switching device, wherein the anode of the LED is electrically connected to the second switching device, and wherein to cause the node to deliver the second electrical signal to the LED, the processing circuitry is configured to cause the node to deliver the second electrical signal to the anode of the LED, wherein the second electrical signal includes a voltage of 0V.

6. The circuit of claim 3, wherein the node is a first node, and wherein the circuit further comprises:
   a second node; and
   a third switching device electrically connected to the LED, and wherein to determine that the LED is associated with the bright failure condition, the processing circuitry is configured to:
   turn off the first switching device;
   turn on the third switching device in order to deliver a third electrical signal from the LED to the second node;
   receive, from a sense device electrically connected to the second node, a sense signal which identifies that the LED conducts electricity while the first switching device is turned off; and
   determine, based on the sense signal, that the LED is associated with a bright failure condition.

7. The circuit of claim 1, wherein the LED is a first LED, and wherein the processing circuitry is further configured to determine that a second LED of the plurality of LEDs is associated with a dark failure condition.

8. The circuit of claim 7, wherein the processing circuitry is further configured to:
   determine that a third LED of the plurality of LEDs is associated with a low-light failure condition; and
   disable the third LED in response to detecting the low-light failure condition.

9. The circuit of claim 8, wherein to determine that the third LED is associated with a low-light failure condition, the processing circuitry is configured to:
   identify an output voltage value corresponding to the third LED;
   determine whether the output voltage value corresponding to the third LED is less than a threshold output voltage value; and
   a determine that the third LED is associated with a low-light failure condition based on the output voltage value of the third LED being less than the threshold output voltage value.

10. A method for controlling a plurality of light emitting diodes (LEDs), the method comprising: controlling whether an LED of the plurality of LEDs receives a first electrical signal from a first power source; receiving, by a node, a second electrical signal from a second power source; determining, by processing circuitry, that the LED is associated with a bright failure condition by attempting to prevent the LED from receiving the first electrical signal from the f power source using a switching device, wherein the switching device is electrically connected to the LED; and disabling, by the processing circuitry, the LED in response to detecting the bright failure condition, wherein disabling the LED comprises causing the node to deliver the second electrical signal to the LED in order to permanently prevent the LED from emitting photons.

11. The method of claim 10, wherein the switching device is one of a set of switching devices, wherein each switching device of the set of switching devices is electrically connected to a respective LED of the plurality of LEDs, and wherein the method further comprises: determining that at least one other LED of the plurality of LEDs is associated with the bright failure condition by attempting to prevent the LED from receiving the first electrical signal from the fir power source using respective switching devices of the set of switching devices; and disabling the at least one other LED in response to detecting the bright failure condition.

12. The method of claim 11, wherein the switching device is a first switching device, wherein a second switching device is electrically connected to the LED, and wherein causing the node to deliver the second electrical signal to the LED comprises turning on, by the processing circuitry, the second switching device, causing the second power source to deliver the second electrical signal to the LED via the node.

13. The method of claim 12, wherein a cathode of the LED is electrically connected to the first switching device, wherein the cathode of the LED is electrically connected to the second switching device, and wherein causing the node to deliver the second electrical signal to the LED comprises causing the node to deliver the second electrical signal to the cathode of the LED, wherein the second electrical signal includes a voltage within a range from a safe operating voltage of the LED and a breakdown voltage of the LED.

14. The method of claim 12, wherein an anode of the LED is electrically connected to the first switching device, wherein the anode of the LED is electrically connected to the second switching device, and wherein causing the node to deliver the second electrical signal to the LED comprises causing the node to deliver the second electrical signal to the anode of the LED, wherein the second electrical signal includes a voltage of 0V.

15. The method of claim 12, wherein determining that the LED is associated with the bright failure condition comprises:
   turning off the first switching device;
   turning on a third switching device in order to deliver a third electrical signal from the LED to a second node, wherein the third switching device is electrically connected to the LED;
   receiving, from a sense device electrically connected to the second node, a sense signal which identifies that the LED conducts electricity while the first switching device is turned off; and
   determining, based on the sense signal, that the LED is associated with a bright failure condition.

16. The method of claim 10, wherein the LED is a first LED, and wherein the method further comprises determining, by the processing circuitry, that a second LED of the plurality of LEDs is associated with a dark failure condition.

17. The method of claim 16, further comprising:
   determining, by the processing circuitry, that a third LED of the plurality of LEDs is associated with a low-light failure condition; and disabling the third LED in response to detecting the low-light failure condition.

18. A system for controlling a plurality of light emitting diodes a (LEDs), the system comprising:
the plurality of LEDs;
a switching device, wherein the switching device is electrically connected to an LED of the plurality of LEDs, and wherein the switching device is configured to control whether the LED receives a first electrical signal from a first power source;
a node configured to receive a second electrical signal from a second power source; and
processing circuitry configured to:
  determine that the LED is associated with a bright failure condition by attempting to prevent the LED from receiving the first electrical signal from the first power source using the switching device; and
  disable the LED in response to detecting the bright failure condition, wherein to disable the LED, the processing circuitry is configured to cause the node to deliver the second electrical signal to the LED in order to permanently prevent the LED from emitting photons.

* * * * *